United States Patent
McGrath

(10) Patent No.: US 10,440,298 B2
(45) Date of Patent: Oct. 8, 2019

(54) EXTENDED DYNAMIC RANGE CIS PIXEL ACHIEVING ULTRA-LOW NOISE

(71) Applicant: BAE SYSTEMS Information and Electronic Systems Integration Inc., Nashua, NH (US)

(72) Inventor: R Daniel McGrath, Lexington, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 62 days.

(21) Appl. No.: 15/390,206

(22) Filed: Dec. 23, 2016

(65) Prior Publication Data

US 2018/0184021 A1 Jun. 28, 2018

(51) Int. Cl.
- *H04N 5/357* (2011.01)
- *H01L 27/146* (2006.01)
- *H04N 5/374* (2011.01)
- *H04N 5/378* (2011.01)

(52) U.S. Cl.
CPC ..... *H04N 5/3575* (2013.01); *H01L 27/14609* (2013.01); *H01L 27/14612* (2013.01); *H01L 27/14643* (2013.01); *H04N 5/374* (2013.01); *H04N 5/378* (2013.01)

(58) Field of Classification Search
CPC ...... H04N 5/3575; H04N 5/378; H04N 5/374; H01L 27/14609; H01L 27/14612; H01L 27/14643
See application file for complete search history.

(56) References Cited

U.S. PATENT DOCUMENTS

| | | | | |
|---|---|---|---|---|
| 6,046,444 A | * | 4/2000 | Afghahi | G11C 7/005 250/208.1 |
| 6,781,627 B1 | * | 8/2004 | Takayanagi | H04N 5/363 348/301 |
| 7,349,018 B2 | * | 3/2008 | Doering | H01L 27/14609 250/208.1 |
| 2008/0173909 A1 | * | 7/2008 | Parks | H04N 5/3559 257/292 |
| 2009/0219427 A1 | | 9/2009 | Kim et al. | |
| 2009/0256060 A1 | * | 10/2009 | Meynants | H04N 5/353 250/208.1 |
| 2012/0002089 A1 | | 1/2012 | Wang et al. | |

FOREIGN PATENT DOCUMENTS

CN 103873787 A 6/2014

OTHER PUBLICATIONS

Kim et al., A Wide Dynamic Range CMOS Image Sensor With Dual Capture Using Floating Diffusion Capacitor. 2007 International Image Sensor Workshop, Ogunquit Maine, US. pp. 90-93. 2007.

(Continued)

*Primary Examiner* — Lin Ye
*Assistant Examiner* — John H Morehead, III
(74) *Attorney, Agent, or Firm* — Maine Cernota & Rardin

(57) ABSTRACT

An extended range Compatible Metal Oxide Semiconductor Image Sensor and method for operating it is provided, the sensor comprising: a first conversion node; a first switch connected to said first conversion node; a second switch disposed in series with said first switch; and a capacitive element disposed between said first and said second switches.

17 Claims, 4 Drawing Sheets

(56) References Cited

OTHER PUBLICATIONS

Wang et al., An 89dB Dynamic Range CMOS Image Sensor With Dual Transfer Gate Pixel, 2011 International Image Sensor Workshop, Hokkaido, Japan. 2007.

International Search Report, PCT/US2017/067654, dated Mar. 9, 2018. 8 pages.

Xiangli Li, MOSFET Modulated Dual Conversion Gain CMOS Image Sensors, A dissertation submitted in partial fulfillment of the requirements for the degree of Doctor of Philosophy in Electrical and Computer Engineering, Boise State University, Nov. 2008.

\* cited by examiner

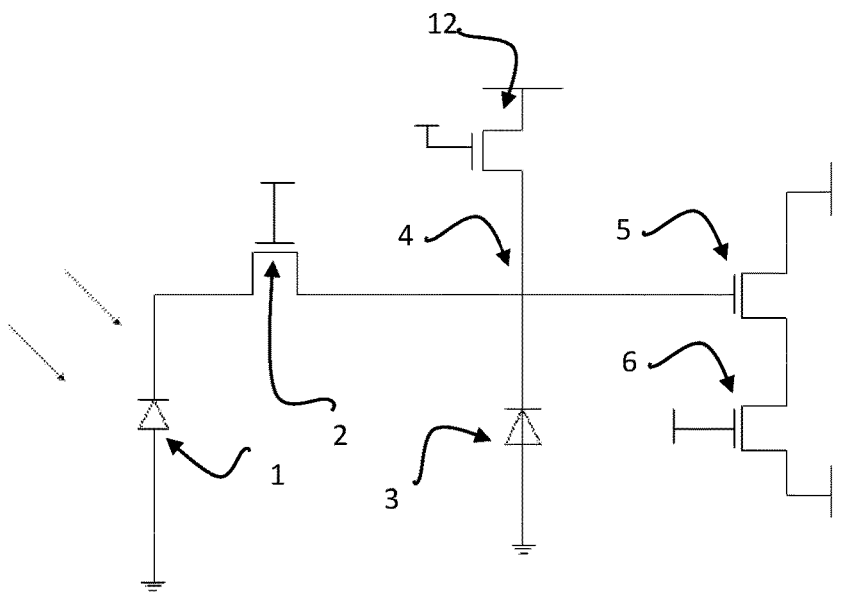
Fig. 1
(Prior Art)
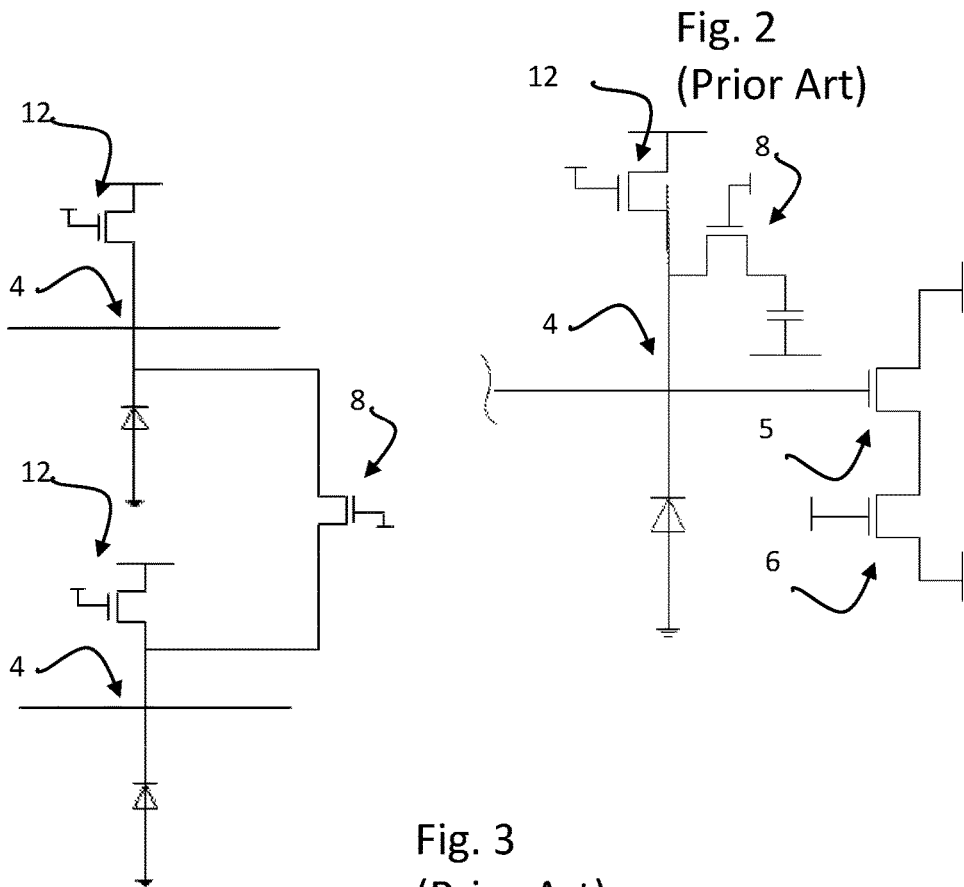
Fig. 2
(Prior Art)
Fig. 3
(Prior Art)

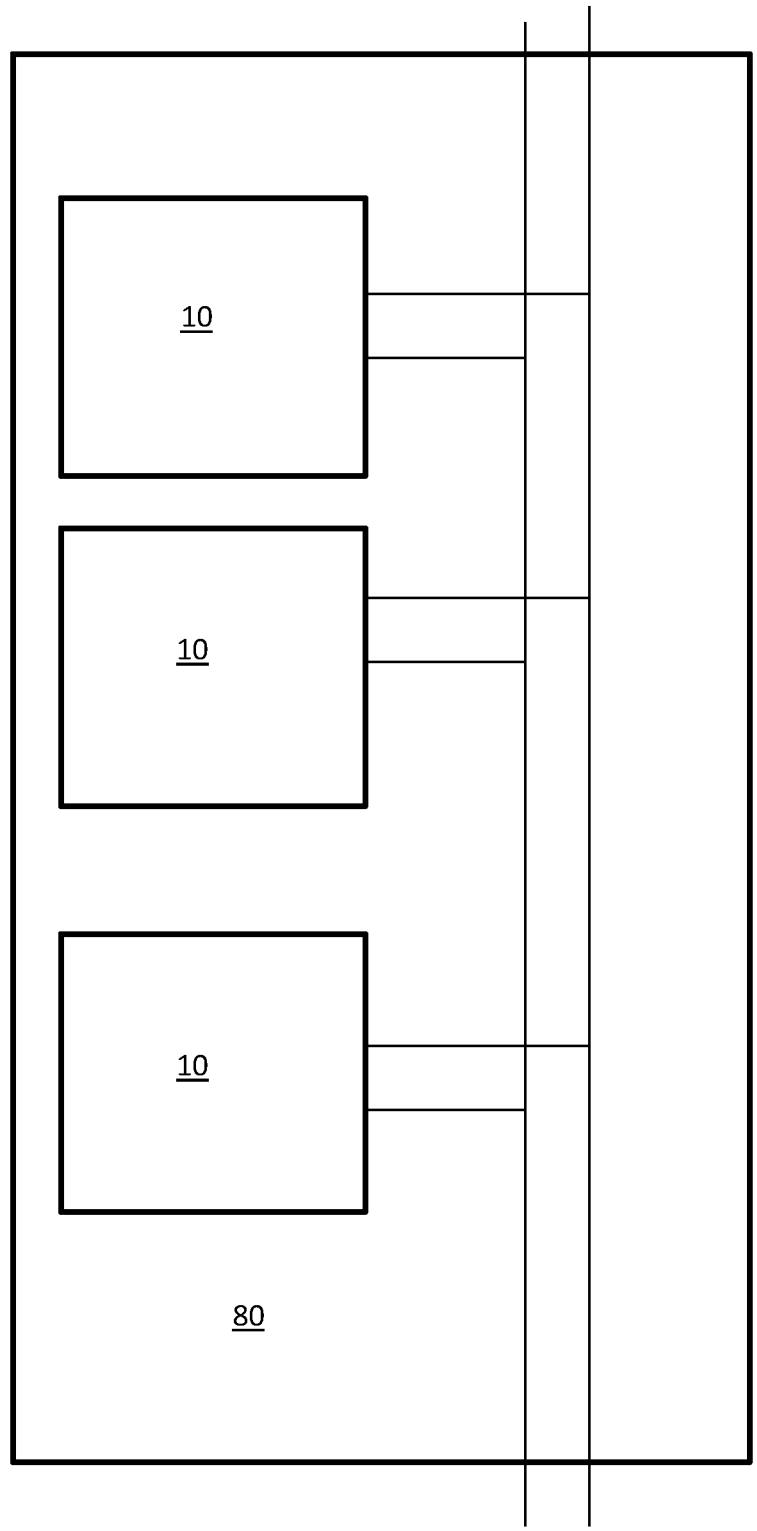

EXTENDED DYNAMIC RANGE CIS PIXEL ACHIEVING ULTRA-LOW NOISE

FIELD

The invention relates to Complementary Metal Oxide Semiconductor (CMOS) Image Sensors, and more particularly, to a CMOS Imaging Sensor (CIS) having extended range and low noise.

BACKGROUND

Ultra-low noise in a Complementary Metal Oxide Semiconductor (CMOS) Image Sensor (CIS) pixel requires minimizing the capacitance of conversion node. However, minimizing the capacitance limits the full well because the voltage on the output signal line has a limited range. A traditional CIS pixel is illustrated in FIG. 1 and comprises a photodiode 1, for generating an electric charge incident upon the photodiode 1. The photodiode is connected to a transfer gate or switch 2, which is in turn connected to a conversion node 4 having a reset switch 12 and diode 3. The conversion node 4, also known in the industry as a floating diffusion, outputs to an active transistor 5, which is often implemented as a source follower, and the pixel is controlled by a select Field Effect Transistor (FET) 6.

Known systems, such as those in FIG. 2 and FIG. 3, overcome the limited full well problem by adding an additional switch or FET 8 acting as a switch to allow additional capacitance, either in the form of an additional capacitor or by utilizing the parasitic capacitance of the reset switch of a neighboring pixel connected with a switch 8 added in parallel to the conversion node 4 to provide a second mode with higher noise and higher read noise. The problem is that adding the extra component directly on the conversion node means that the noise in the low noise mode is not as low as for a pixel without this feature. What is needed, therefore, are techniques for providing a CIS pixel with low capacitance, low noise, and an improved full well.

SUMMARY

One embodiment of the disclosure provides an extended range Compatible Metal Oxide Semiconductor Image sensor, the sensor comprising: a first conversion node; a first switch connected to the first conversion node; a second switch disposed in series with the first switch; and a capacitive element disposed between the first and the second switches.

Another embodiment of the disclosure provides such a sensor wherein the capacitive element comprises a capacitor.

A further embodiment of the disclosure provides such a sensor wherein the capacitive element comprises a design element having parasitic capacitance.

Still another embodiment of the disclosure provides such a sensor wherein the capacitive element comprises at least one capacitor and at least one design element having parasitic capacitance.

A still further embodiment of the disclosure provides such a sensor wherein the design element comprises a third switch disposed between the first conversion node and a second conversion node.

Even another embodiment of the disclosure provides such a sensor wherein the third switch is a Field Effect Transistor.

An even further embodiment of the disclosure provides such a sensor wherein the second switch is a Field Effect Transistor.

Yet another embodiment of the disclosure provides such a sensor wherein the first switch is a Field Effect Transistor.

One embodiment of the disclosure provides a method for obtaining a wide dynamic range image from a CIS sensor, the method comprising: selecting at least a pixel of the sensor; activating first and second switches to reset the sensor; turning off the first and the second switches and allowing a conversion node of the pixel to float; sampling the high gain reference signal with the pixel; activating a transfer switch on the pixel and deactivating the transfer switch; sampling a selected high gain signal; activating the transfer and the first switch to provide increased capacitance and sampling of a selected low gain signal; activating the second switch; sampling a reference low gain signal; and calculating from the reference high gain signal, the selected high gain signal, the reference low gain signal, and the selected low gain signal wherein the signal vs. illumination relation is equal to the sum of the difference between the select and reference high gain with the difference of the select and reference low gain.

One embodiment of the present disclosure provides an image sensor, the image sensor comprising: an array of CMOS Image Sensor pixels wherein each the pixel in the array comprises: a first conversion node; a first switch connected to the first conversion node; a second switch disposed in series with the first switch; and a capacitive element disposed between the first and the second switches.

Another embodiment of the present disclosure provides such a sensor wherein the capacitive element comprises a capacitor.

A further embodiment of the present disclosure provides such a sensor wherein the capacitive element comprises a design element having parasitic capacitance.

Yet another embodiment of the present disclosure provides such a sensor wherein the capacitive element comprises both at least one capacitor and at least one design element having parasitic capacitance.

A yet further embodiment of the present disclosure provides such a sensor wherein the design element comprises a third switch disposed between the first conversion node and a second conversion node.

Still another embodiment of the present disclosure provides such a sensor wherein the third switch is a Field Effect Transistor.

A still further embodiment of the present disclosure provides such a sensor wherein the second switch is a Field Effect Transistor.

Even another embodiment of the present disclosure provides such a sensor wherein the first switch is a Field Effect Transistor.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1 is a block diagram illustrating a known CMOS Imaging sensor pixel.

FIG. 2 is a block diagram illustrating a detail of a known CMOS Imaging sensor pixel with a low gain mode.

FIG. 3 is a block diagram illustrating details of a known system with a low gain mode having connected CMOS Imaging sensor pixels.

FIG. 7 is a block diagram illustrating an array of CMOS Imaging sensor pixel with enhanced dynamic range configured in accordance with one embodiment of the disclosure.

DETAILED DESCRIPTION

Ultra-low noise in a CIS pixel requires minimizing the capacitance of the conversion node. However, lowering the capacitance limits the full well because the voltage on the output signal line has a limited range. One embodiment of the present technique increases the sensor dynamic range by increasing the full well capacity of the pixel by putting added capacitance in the reset path, instead of as a separate switch. This means that no capacitance is added for the conversion node in the low noise mode. This is done in one example by putting a second FET in the pixel in series to the reset gate and using the combination to allow extra capacitance to be added. In a further example, a capacitor is added between the switches. Reset is enabled by closing both switches, wherein the high full well is enabled by only turning on the switch next to the conversion node to add capacitance during correlated double sampling and low noise full well is enabled by turning off both switches during correlated double sampling. There are other possible options that add the extra capacitance by tying together adjoining conversion nodes that are sequentially used for correlated double sampling for the pixels involved—for example, in embodiments a node away from the conversion node is tied by a switch to connect pixels in adjoin rows in a rolling shutter readout. According to one application, the CMOS Image Sensor is used in a "dual-mode" manner, operating as an ultra-low light, low read noise, photon counting mode, but then, in a higher light situation, configured to give up read noise and low light response in order to not saturate so quickly.

Figure 4:
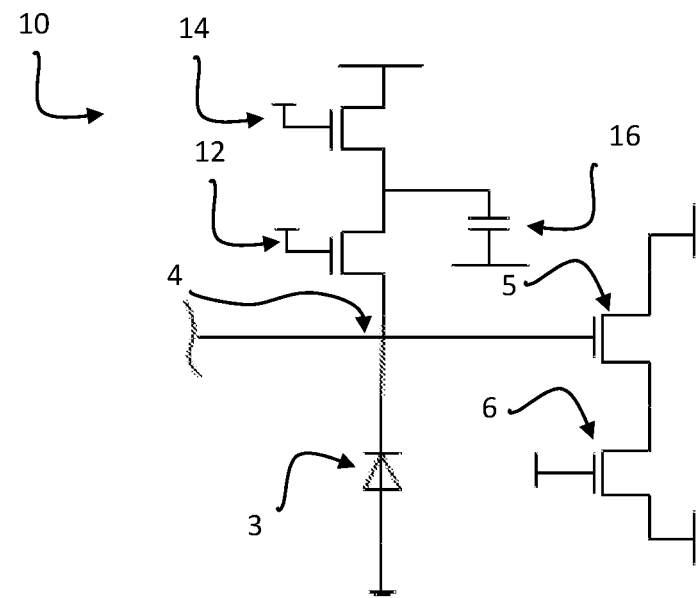
FIG. 4 is a block diagram illustrating a detail a CMOS Imaging sensor pixel with enhanced dynamic range configured in accordance with one embodiment of the disclosure.

Referring to FIG. 4, one embodiment of the sensor 10 provides the added capacitance in the reset path proximate to a reset gate or switch 12. In such an embodiment, no additional capacitance is added for the conversion node 4 in the low-noise mode. This can be done by putting a second switch 14 in series to the first switch or reset gate 12 and using the combination to allow extra capacitance to be added through a capacitive element 16. According to various embodiments, the switches 12, 14 of the disclosure may be implemented as FETs.

As illustrated in the detail of a CIS pixel shown in FIG. 4, one embodiment provides a capacitive element 16 that comprises a capacitor added between the first switch 12 and second switch 14, wherein the capacitor 16 is selectively added in order to substantially fill the well.

In operation, a photonic element such as a photodiode (not shown) is connected to the conversion node 4. The conversion node 4 or floating diffusion node, outputs to an active or transfer switch 5, which is often implemented as a source follower, and the pixel 10 is controlled by a select FET 6.

Figure 5:
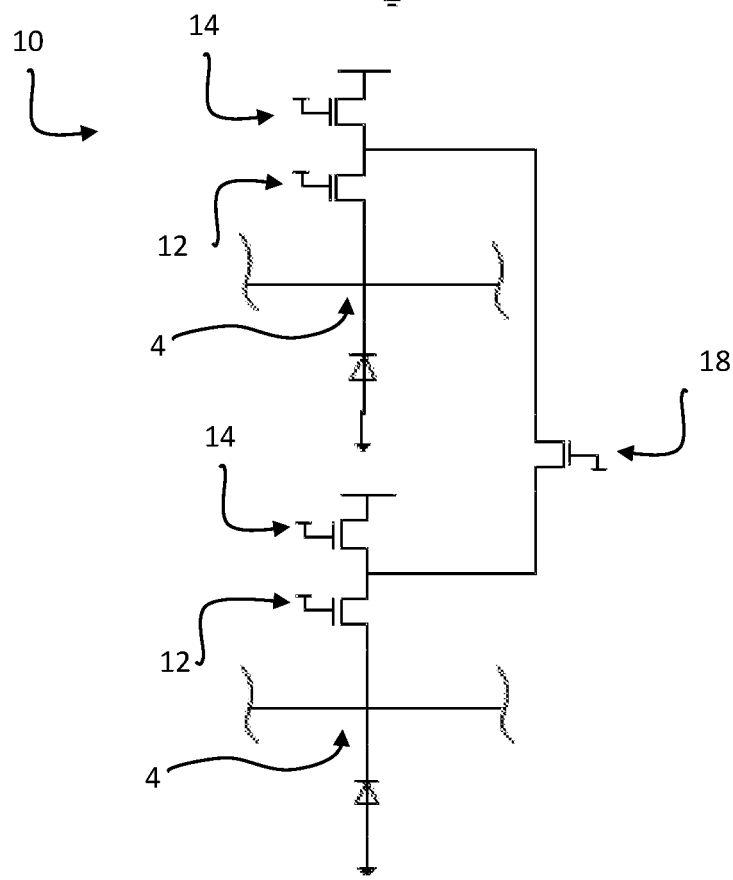
FIG. 5 is a block diagram illustrating details of system with a connected CMOS Imaging sensor pixels providing enhanced dynamic range and configured in accordance with one embodiment of the disclosure.

In alternative embodiments, such as that of FIG. 5, capacitive element 16 is configured to provide additional capacitance and thus increase the range of the system, and may comprise parasitic capacitance from other elements of the sensor. Such a technique is specifically shown in FIG. 5, where adjoining conversion nodes 4 are connected with an additional third switch 18. In this way, the parasitic capacitance of the non-selected pixel's reset switch 12 and second switch 14 is used to increase the overall capacitance of the selected pixel when the high capacitance mode is activated.

Figure 6:
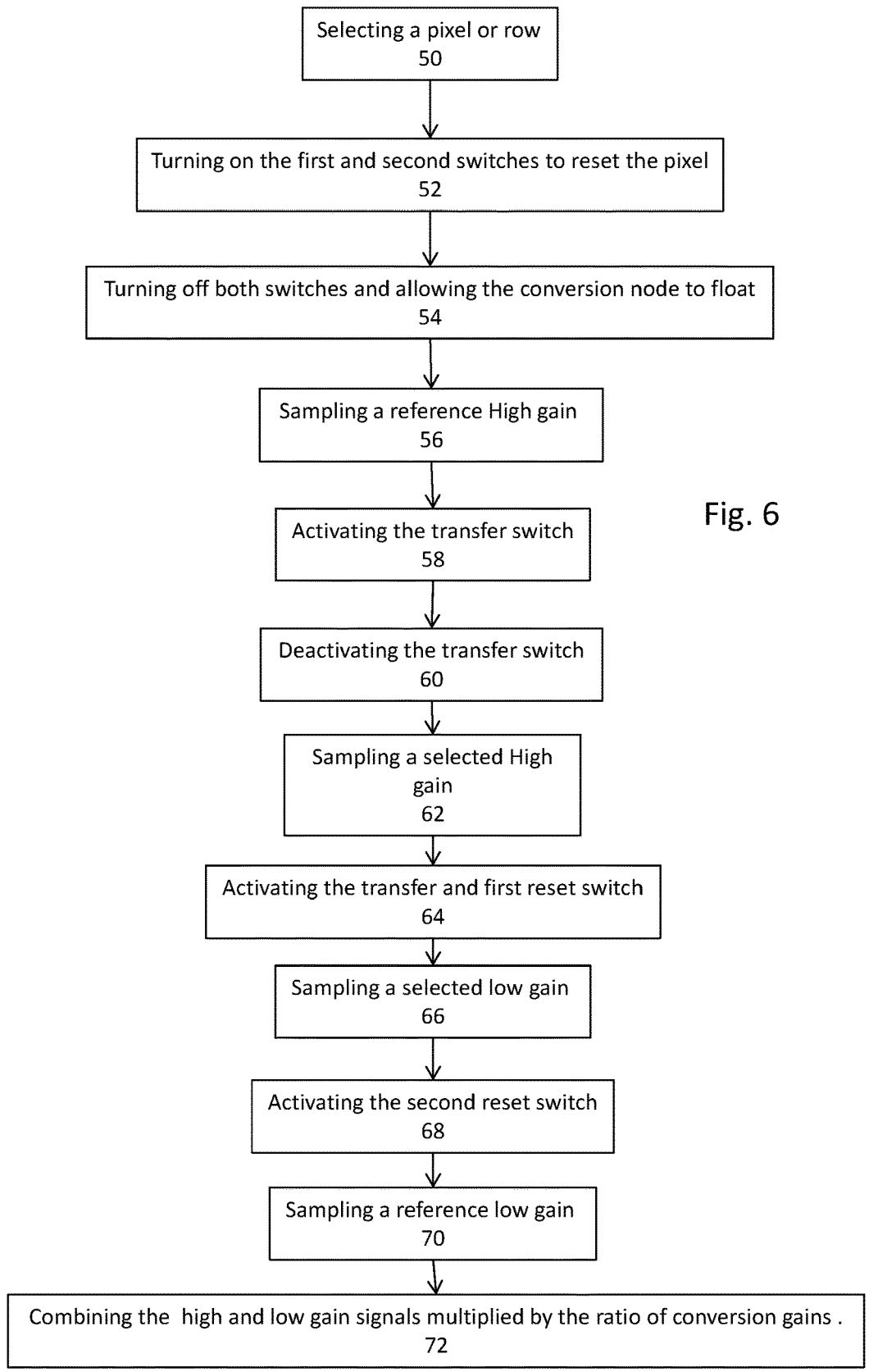
FIG. 6 is a flow chart illustrating a method of operating CMOS Imaging sensor pixels providing enhanced dynamic range and configured in accordance with one embodiment of the disclosure.

As illustrated in the flow chart of FIG. 6, a method is provided for operating a system configured in accordance with embodiments of the present disclosure. First, a pixel or row of pixels is selected 50, both the first and second switches are activated to reset the sensor 52 and, once it is reset, they are turned off and the conversion node 4 is allowed to float 54. The high gain reference signal can then be sampled 56 and the transfer switch activated 58 and deactivated 60. A selected high gain signal may then be sampled 62. Both the transfer and reset switch are then activated 64 to provide increased capacitance and allow for the sampling of a selected low gain signal 66, then the second switch is activated 68 and a reference low gain signal is sampled 70. The high gain signal is combined mathematically 72 with the low gain signal and multiplied by the ratio of the conversion gains in the two modes so that the high gain difference signal provides the signal for pixels in the low illumination areas from the scene, so the low gain signal multiplied by the ratio provides the signal for pixels in the high illumination areas of the scene, and so that there is a smooth transition for pixels at the pixels with illumination where the two ranges overlap.

As illustrated in FIG. 7, one embodiment of the disclosure may comprise a plurality of such pixels 10 arranged in an array. The pixels are electrically interconnected to provide for an imaging sensor device 80. The array is typically a two-dimensional array of rows and columns arranged in a matrix.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An extended range Complementary Metal Oxide Semiconductor (CMOS) Image sensor, said sensor comprising:
    a first conversion node coupled to a photodiode;
    a first switch connected to said first conversion node;
    a second switch disposed in series with said first switch; and
    a capacitive element disposed between said first and said second switches and wherein said first switch, second switch and capacitive element are disposed in a reset path such that said capacitive element is electronically isolated from said first conversion node when said first switch is turned off.

2. The sensor of claim 1 wherein said capacitive element comprises a capacitor.

3. The sensor of claim 1 wherein said capacitive element comprises a design element having parasitic capacitance.

4. The sensor of claim 1 wherein said capacitive element comprises at least one capacitor and at least one design element having parasitic capacitance.

5. The sensor of claim 3 wherein said design element comprises a third switch disposed between said first conversion node and a second conversion node.

6. The sensor of claim 5 wherein said third switch is a Field Effect Transistor.

7. The sensor of claim 1 wherein said second switch is a Field Effect Transistor.

8. The sensor of claim 1 wherein said first switch is a Field Effect Transistor.

9. A method for obtaining a dynamic range image from a CMOS Imaging Sensor (CIS), said method comprising:
  selecting at least a pixel of said sensor;
  activating first and second switches to reset the sensor;
  turning off said first and said second switches and allowing a conversion node of said pixel to be electronically isolated from other nodes;
  sampling a high gain reference signal with said pixel;
  activating a transfer switch on said pixel and deactivating said transfer switch;
  sampling a selected high gain signal;
  activating said transfer and said first switch to provide increased capacitance and sampling of a selected low gain signal;
  activating said second switch;
  sampling a reference low gain signal; and
  combining said a difference of said selected high gain signal and said high gain reference signal mathematically with the difference of said selected low gain signal and a low gain reference signal mathematically multiplied by a ratio of conversion gains in two modes; wherein said high gain signal provides a signal for said pixel if it is in a low illumination range, said low gain signal multiplied by the ratio provides a signal for said pixel if it is in a high illumination range, providing a smooth transfer function spanning high and low gain for said pixel if it has illumination between said high and low illumination ranges such that there is no discontinuity in said transfer function between high and low gain modes.

10. An image sensor, said image sensor comprising:
  an array of CMOS Image Sensor pixels wherein each said pixel in said array comprises: a first conversion node;
  a first switch connected to said first conversion node;
  a second switch disposed in series with said first switch; and
  a capacitive element disposed between said first and said second switches and wherein said first switch, second switch and capacitive element are disposed in a reset path such that said capacitive element is electronically isolated from said first conversion node when said first switch is turned off.

11. The sensor of claim 10 wherein said capacitive element comprises a capacitor.

12. The sensor of claim 10 wherein said capacitive element comprises a design element having parasitic capacitance.

13. The sensor of claim 10 wherein said capacitive element comprises both at least one capacitor and at least one design element having parasitic capacitance.

14. The sensor of claim 12 wherein said design element comprises a third switch disposed between said first conversion node and a second conversion node.

15. The sensor of claim 14 wherein said third switch is a Field Effect Transistor.

16. The sensor of claim 10 wherein said second switch is a Field Effect Transistor.

17. The sensor of claim 10 wherein said first switch is a Field Effect Transistor.

\* \* \* \* \*